United States Patent [19]
Li et al.

[11] Patent Number: 5,536,085
[45] Date of Patent: Jul. 16, 1996

[54] MULTI-WAVELENGTH GAIN-COUPLED DISTRIBUTED FEEDBACK LASER ARRAY WITH FINE TUNABILITY

[75] Inventors: Guo P. Li, Ottawa; Toshihiko Makino, Nepean; Andrew M. Sarangan; Weiping Huang, both of Waterloo, all of Canada

[73] Assignee: Northern Telecom Limited, Montreal, Canada

[21] Appl. No.: 413,555

[22] Filed: Mar. 30, 1995

[51] Int. Cl.[6] ................................................ H01S 3/10
[52] U.S. Cl. ................................ 372/50; 372/20; 372/23; 372/46; 372/96
[58] Field of Search .......................... 372/20, 23, 45, 372/46, 50, 96

[56] References Cited

U.S. PATENT DOCUMENTS 5,173,909  12/1992  Sakano et al. ...................... 372/20
5,311,540   5/1994  Pocholle et al. .................... 372/23
5,347,526   9/1994  Suzuki et al. ....................... 372/20
5,384,797   1/1995  Welch et al. ........................ 372/23

OTHER PUBLICATIONS

"Tunable DFB Laser with a Striped Thin–Film Heater", Sakano et al, IEEE Photonics Technology Letters, vol. 4, No. 4, Apr. 1992, pp. 321–323.
"Integrated Four–Wavelength DFB Laser Array with 10 Gb/s Speed and 5 nm Continuous Tuning Range", Wang et al, IEEE Photonics Technology Letters, vol. 4, No. 4, Apr. 1992, pp. 318–320.

Primary Examiner—James W. Davie
Attorney, Agent, or Firm—George MacGregor

[57] ABSTRACT

A multi-wavelength laser array having a plurality of gain-coupled distributed feedback ridge waveguide lasers. The operational wavelength of each laser is established by selecting a width of the ridge waveguide in the range 1.6 μm to 5.2 μm. Fine tuning of each central wavelength is achieved by thermal power to selected waveguides via Titanium thin film resistors integrated into the laser array. A wavelength range of 9 nm is demonstrated utilizing a sixteen element array.

10 Claims, 5 Drawing Sheets

MULTI-WAVELENGTH GAIN-COUPLED DISTRIBUTED FEEDBACK LASER ARRAY WITH FINE TUNABILITY

FIELD OF THE INVENTION

This invention relates to a laser diode array and more particularly to an array of gain-coupled DFB lasers wherein each laser in the array is configured to emit at a different operational wavelength with provision for selectively fine tuning each operational wavelength.

BACKGROUND OF THE INVENTION

Using current technology the transmission distance of fiber optic communication systems is several hundreds of kilometers at a 2.5 Gbit/s modulation rate. Speed constraints associated with electronic components and wavelength chirp induced errors pose limitations on achieving higher data rates using modulated optical transmitters. Nevertheless, there is an ongoing requirement to increase the transmission bandwidth in order to allow the delivery of video and high density computer data. It is generally recognized that wavelength division multiplexing (WDM) is an effective technology to increase the capacity of future systems by exploiting the bandwidth capability in single mode fibers and/or erbium doped fiber amplifiers (EDFA). The bandwidth potential of single mode optical fibers is in the terabit range. In order to effectively implement WDM technology, a plurality of wavelength channels are required wherein each channel has the capability of being independently modulated with distinct data trains.

The optimum frequency band for transmission via a single mode optical fiber is relatively narrow taking into account dispersion and attenuation characteristics. Accordingly, it is advantageous to segment the useful transmission window into as many individual channels as possible. This requires transmitters that can be selected or set to emit at exactly a predesigned wavelength. Semiconductor lasers and particularly lasers fabricated from III–V alloys can be tailored to emit in the 1250 nm to 1600 nm wavelength range, the range best suited for single mode optical fibers. A III–V alloy of particular interest is the InGaAsP/InP system which can be used to fabricate lasing devices having an optical output within this range.

It is known, of course, to select discrete laser devices each having a given wavelength and to assemble hybrid arrays of such devices in order to provide a range of discrete channels. Such a process, however, is not cost effective as it requires extensive pre-selection to locate lasers of specific wavelength. Considerable assembly time is also required and extra packaging is necessary. Additionally, the accuracy with which discrete devices may be individually mounted on a carrier is inferior to that which may be attained by monolithic processing equipment. Such hybrid structures also tend to be inferior with respect to stability and reliability.

PRIOR ART

Sakano et al (IEEE Photonics Technology Letters, Vol. 4, No. 4, April 1992, pp. 321–323) and Wang et al (IEEE Photonics Technology Letters, Vol. 4, No. 4, April 1992, pp. 318–320) have proposed techniques for thermally tuning the central wavelength of semiconductor lasers. In these methods the central wavelength is tuned by 4 or 5 nms by utilizing monolithically integrated heaters. This range is considered insufficient to provide a useful array with a multi-wavelength capability.

SUMMARY OF THE INVENTION

The present invention seeks to provide a multi-wavelength laser array of gain-coupled, ridge waveguide DFB lasers wherein the operational wavelength of each laser is slightly different. Further, the invention contemplates the provision of tuning means in order to selectively adjust the operational wavelength of each laser.

Therefore, it is an object of the present invention to provide a multi-wavelength, gain-coupled DFB laser array with fine tunability.

It is a further object of the invention to provide a multi-wavelength, laser array of gain-coupled, DFB semiconductor lasers having ridge waveguides.

It is a still further object of the present invention to provide a multi-wavelength laser array of gain-coupled DFB semiconductor lasers having ridge waveguides with ridges having different widths such that the optical emission occurs at slightly different wavelengths due to the effect of the different effective indices.

It is yet a further object of the present invention to provide a semiconductor laser diode array of gain-coupled DFB ridge waveguide lasers having integrated resistors associated with each laser, the resistors being effective in thermally tuning the operational wavelength.

Therefore in accordance with a first aspect of the present invention there is provided a multi-wavelength laser array comprising a plurality of DFB, gain-coupled, ridge waveguide lasers each configured to emit optical power at a different operational wavelength. Tuning means are associated with each of the lasers for providing dynamic tuning of the operational wavelength.

In accordance with a further aspect of the invention there is provided a multi-wavelength laser array comprising a plurality of single-mode, gain-coupled DFB semiconductor ridge waveguide laser diodes each configured to emit optical power at a slightly different operational wavelength. Tuning means are associated with each laser diode for thermally adjusting the operational wavelength.

BRIEF DESCRIPTION OF THE DRAWINGS

The invention will now be described in greater detail with reference to the appended drawings wherein.

DETAILED DESCRIPTION OF THE INVENTION

Figure 1:
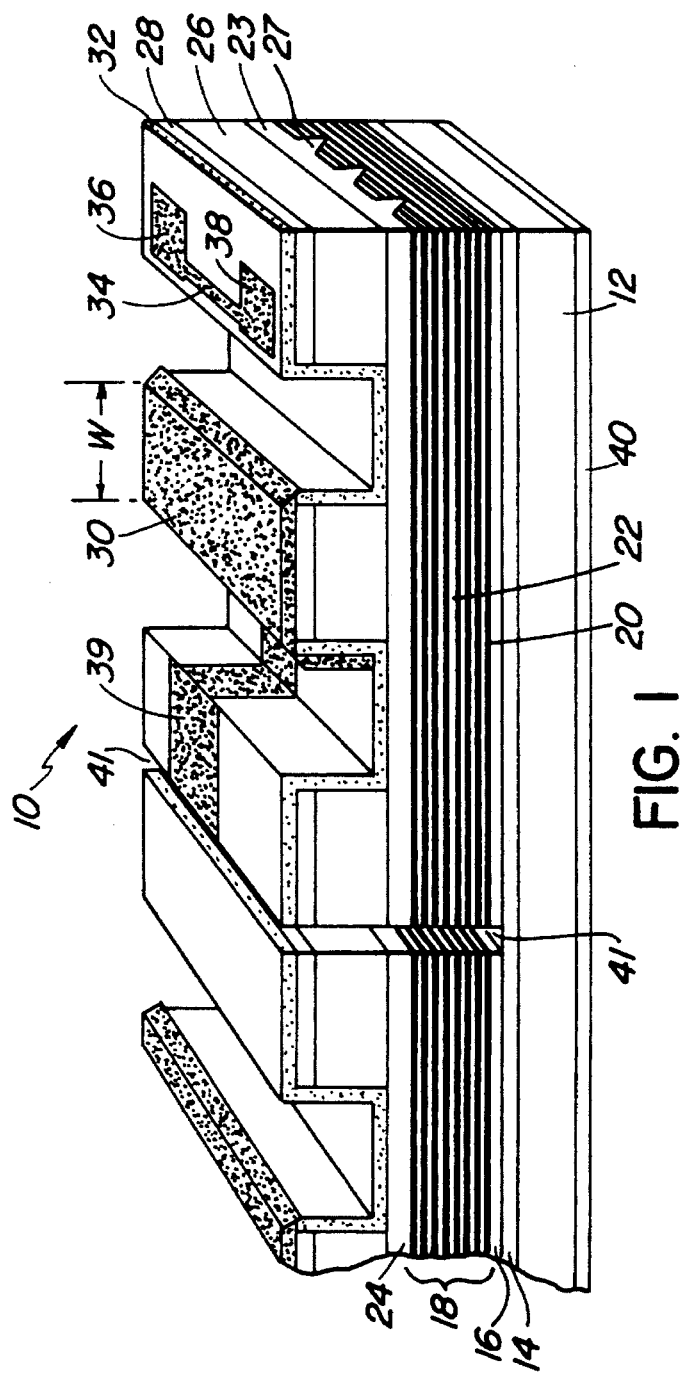
FIG. 1 is a cross-sectional view of one of the diode lasers of the present invention.

FIG. 1 is a perspective view of a ridge waveguide laser 10 according to a preferred embodiment of the invention. The laser structure shown is based on a III–V alloy and more particularly an InGaAsP/InP system. Other III–V alloys such as AlGaAsP/GaAs may also be used in the practical implementation of the invention. In FIG. 1, the laser 10 includes an n-type InP substrate 12 and an n-type InP buffer layer 14, a graded index separate confinement heterostructure (GRIN-SCH) layer 16, and a multi-quantum-well (MQW) active region 18 which consists of eight, 55 Å thick strained (1.3% compressive) InGaAsP quantum wells 20 and seven 100 Å InGaAsP ($\lambda g=1.25$ µm) barriers 22. A second graded index separate confinement heterostructure 23 is on the MQW region. In fabrication of the laser material an in-phase gain coupling grating 27 is subsequently etched into the top GRINSCH layer and MQW region. Gain-coupled lasers are further described in U.S. application Ser. No. 08/170,074 filed Dec. 16, 1993, Makino et al, the disclosure of which is incorporated herein by reference. A p-type InP buffer layer 24, 1.5 µm cladding layer 26 and a 0.2 µm P+type InGaAs cap layer 28 are grown over the grating. The first order gain coupling grating 27 was prepared by reactive ion etch,- followed by a wet chemical etch. As an alternative structure an anti-phase gain-coupled device can be employed.

Both the first and second growth cycles are performed by known growth techniques such as metal organic chemical vapour deposition (MOCVD). The growth technique, material composition, layer thickness, etc. specified above are intended to illustrate one example only and the invention is not limited to this configuration or composition. As indicated previously other material systems can be substituted for those described herein. In the laser structure shown in FIG. 1, a ridge 30 was etched for lateral confinement as is well known. A passivation layer 32 such as $SiO_2$ is deposited on the material surface and thin film resistor 34 is formed on the passivation layer by depositing and subsequently etching (lift-off) a thin resistive film. Contacts 36,38 are also formed on the resistor 34 and p and n contacts 39,40 respectively to the laser device.

As shown in FIG. 1, separation groove 41 is employed to reduce both thermal and electrical cross-talk between adjacent laser diodes. The separation groove 41 is preferably formed by etching through the active region 18.

Figure 2:
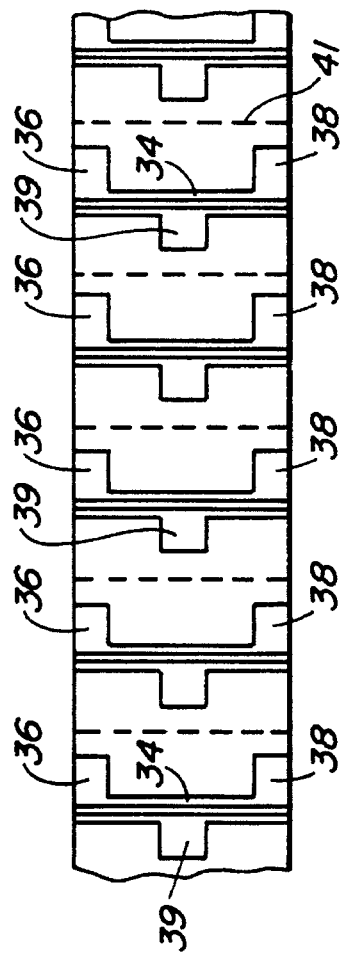
FIG. 2 is a plan view of a partial array of diode lasers showing the contact architecture.

According to the preferred embodiment of the invention a plurality of similar laser structures were formed in a linear array as illustrated in FIG. 2. The figure shows a portion only of the laser array, it being understood that the invention contemplates 16 elements or more depending on device fabrication processes and material availability.

The devices in the array contemplated by FIG. 2 are approximately 500 µm long and both facets are as cleaved. The interval between each laser is preferably 250 µm as this pitch is consistent with an industry standard for optical ribbon cables.

In accordance with an important aspect of the invention the confinement ridge in each laser has a slightly different width ('W' in FIG. 1). The ridge waveguides were formed by reactive ion etching and wet chemical etching with a ridge width variation between 1.6 µm and 5.2 µm. was found that such a width variation could result in an effective index change close to 0.02. In the preferred structure the width variation was implemented from one end of the array to the other so that the width at one end was 1.6 µm and at the opposite end the width was 5.2 µm.

A thin film resistor 34 of material such as titanium having a thickness of approximately 300 nm is integrated onto the array next to each laser element. The resistor width is approximately 10 µm. The average resistance of each resistor is measured to be 660Ω. An Au/Pt/Ti metal pad 36,38 is formed at each end of the stripe resistor to facilitate wire bonding. The distance of each thin film resistor from its associated ridge waveguide is approximately 15 µm. As an alternative to titanium, other materials such as nichrome or platinum may be used to form the thin film resistive element.

As indicated previously, the width of the ridge has an effect on the index of refraction. This in turn results in a difference in the Bragg wavelength of the emission from each waveguide, the difference being 9 nm over this range. The influence of the increase in temperature generated by current passing through the thin film resistor creates a further change in the emission wavelength.

Figure 3:
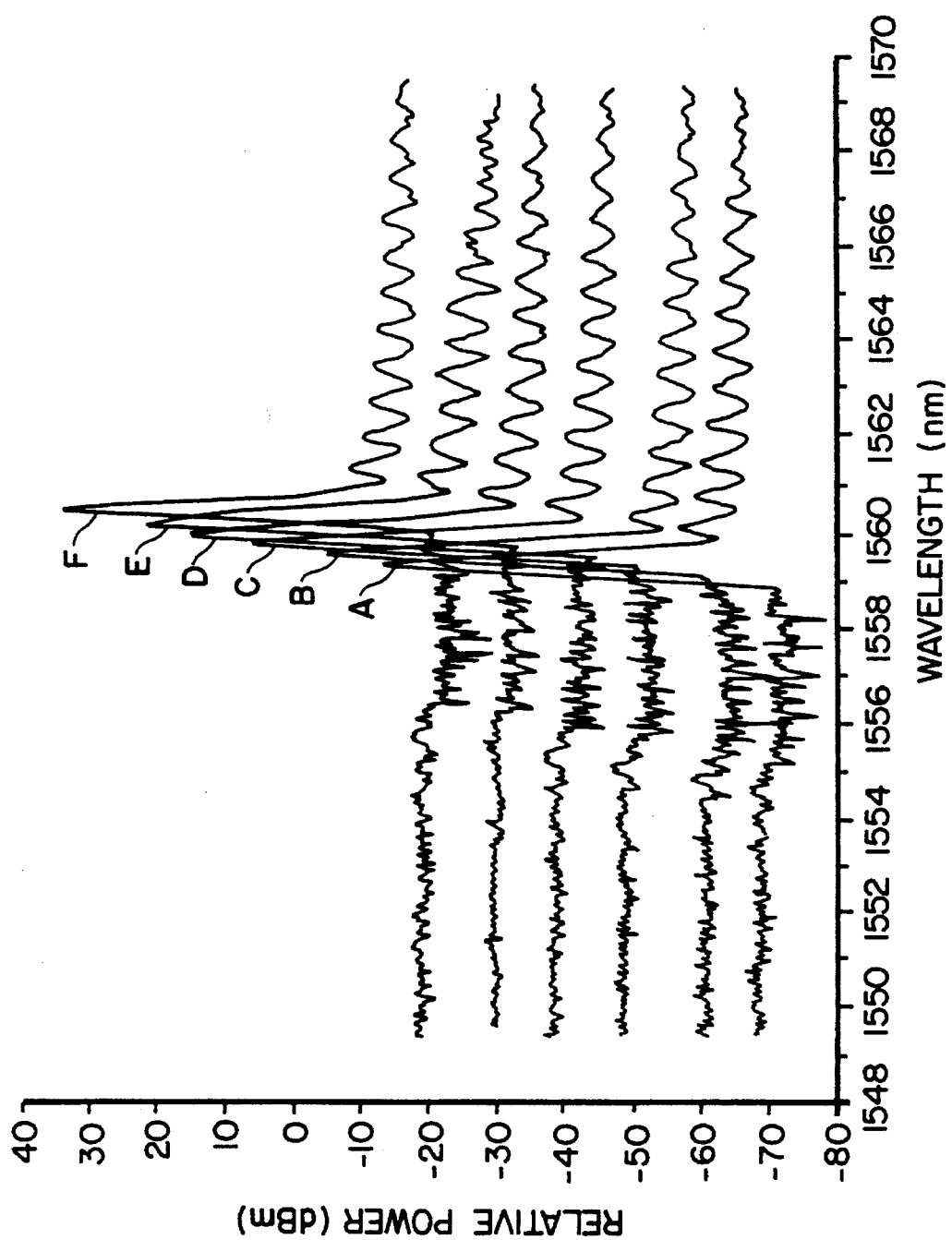
FIG. 3 illustrates the spectra of a single laser of the array under different heating power to the thin film resistor.

Looking initially at the heating effects, it has been discovered that a shift in the operational wavelength of up to 1.1 nm is possible by supplying up to 100 mW thermal power through the resistor. FIG. 3 shows the shift in wavelength for a 2 µm wide ridge waveguide laser when heated by different thermal power settings. In FIG. 3, curve A represents no thermal power to the resistor while curves B, C, D, E and F are for thermal power of 20 mW, 40 mW, 60 mW, 80 mW and 100 mW respectively. A peak wavelength shift of approximately 1 nm is clearly seen.

Figure 4:
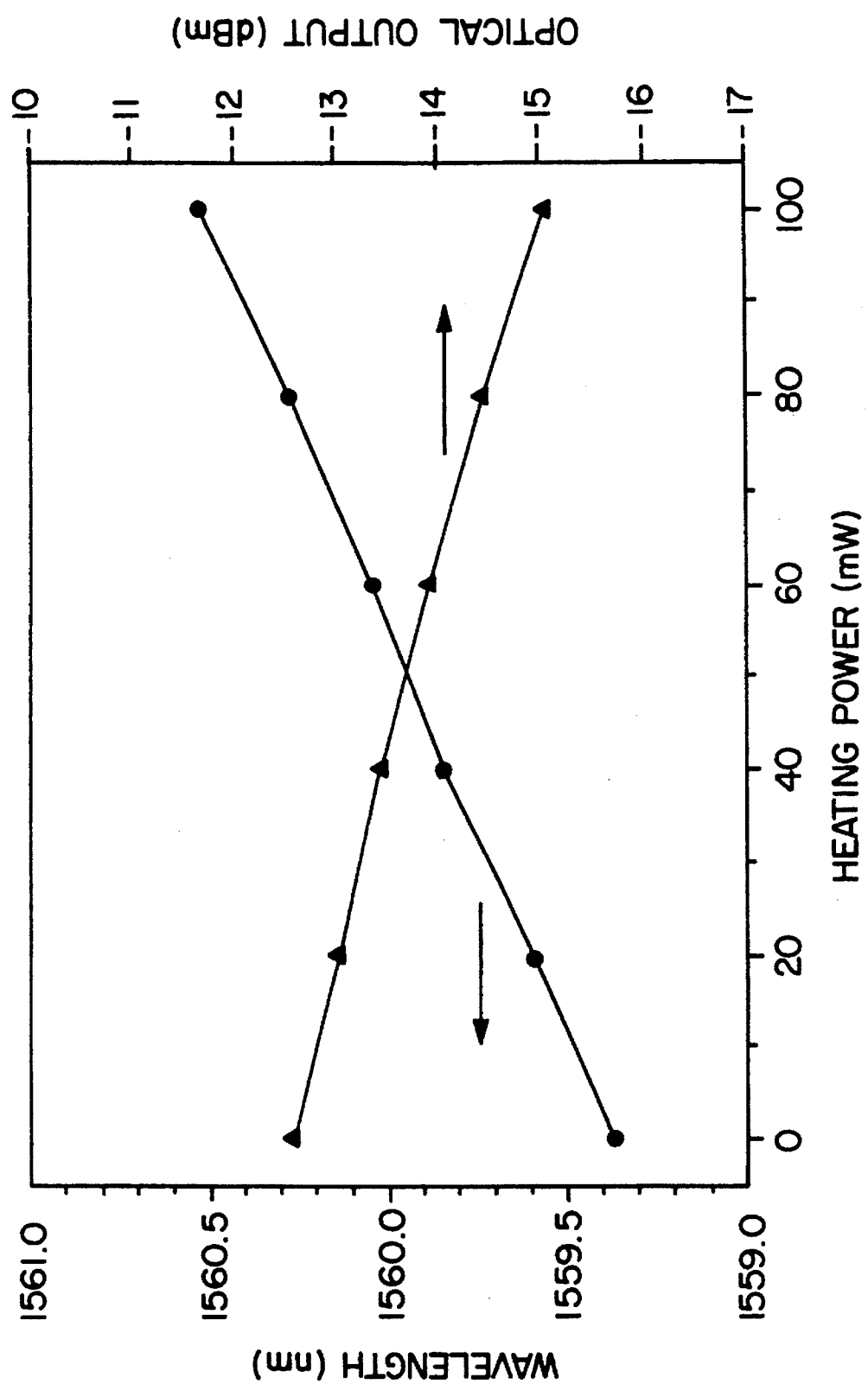
FIG. 4 is a graph of wavelength and optical power output as a function of power supplied to the resistor.

The effect of heating power on optical output as well as wavelength shift is shown in FIG. 4. This figure illustrates that the emission wavelength increases substantially linearly with heating power. The optical output decrease over the range of heating power is less than 3 db. The previously discussed wavelength increase of 1.1 nm associated with 100 mW heating power is demonstrated. The thermal tuning effect is 0.11 Å /mw.

Figure 5:
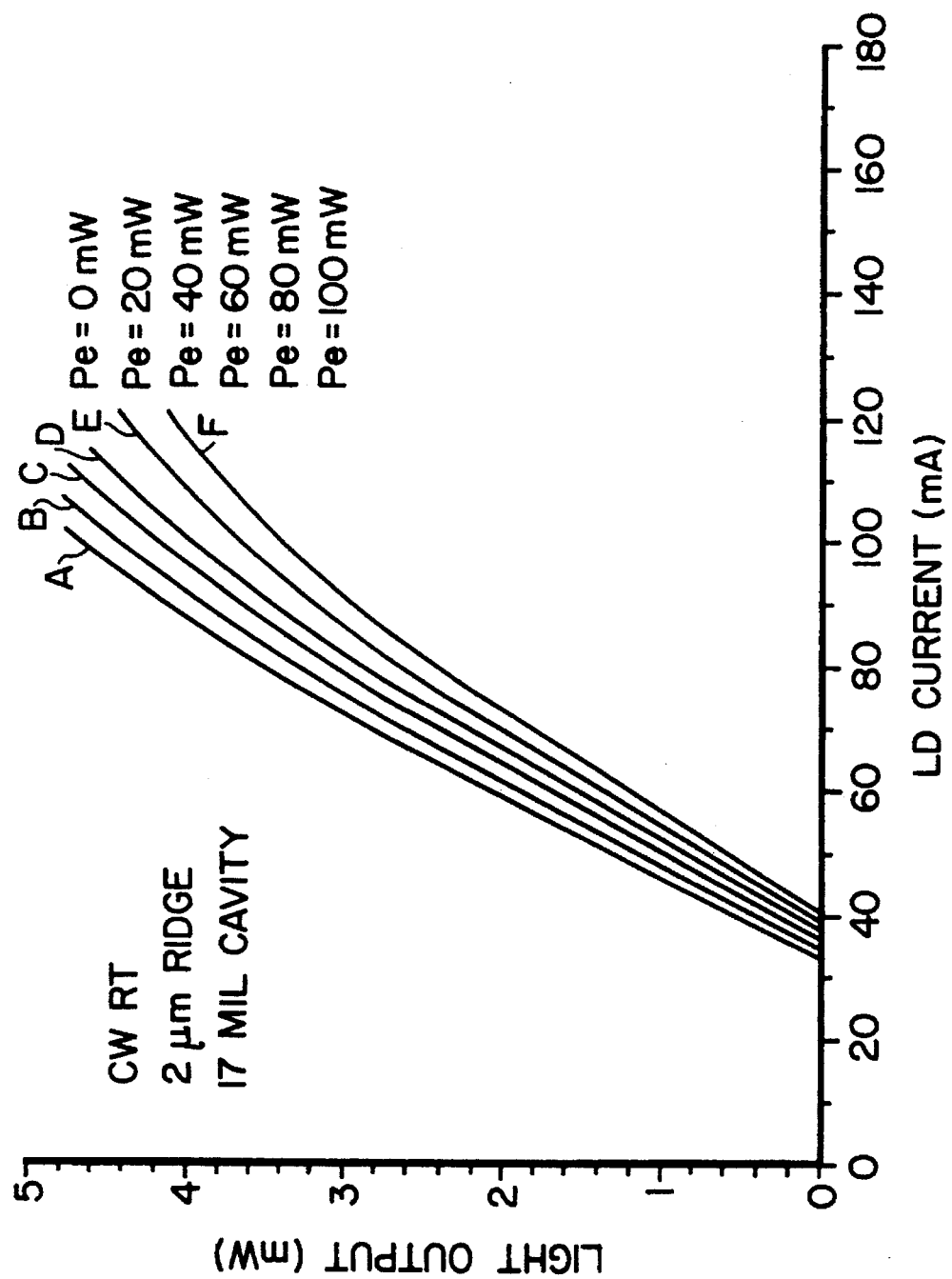
FIG. 5 shows the threshold current shift under different values of heating power.

FIG. 5 shows the relationship between light output and threshold current for different values of heating power to the laser element. The laser in this instance has a ridge width of 2 µm and is operated under C.W. conditions at room temperature. The six curves A–F in FIG. 5 are for no heating power and power of 0.20 mW, 40 mW, 60 mW, 80 mW and 100 mW respectively. The threshold current is increased by approximately 8 mA at 100 mW heating power.

Figure 6:
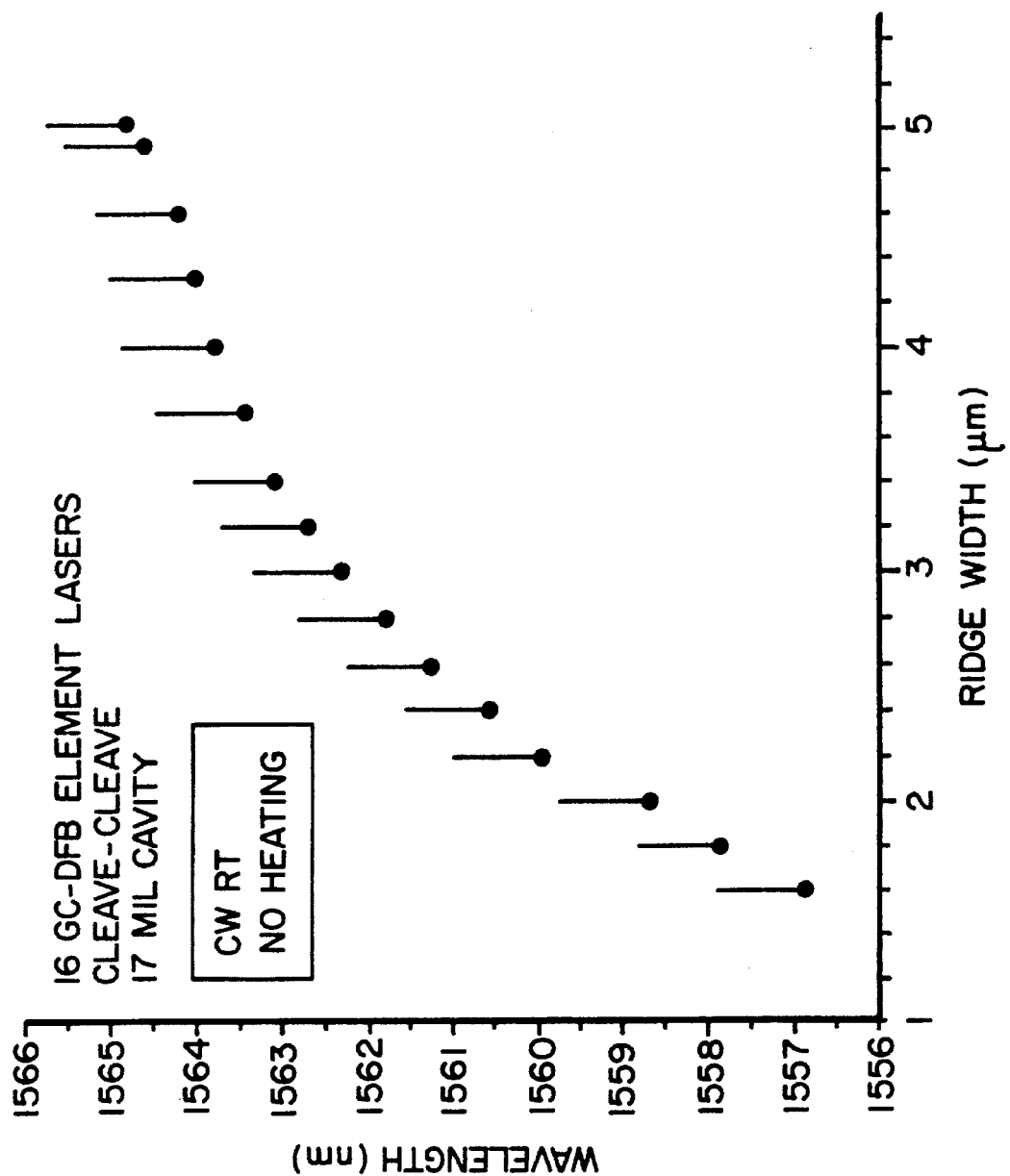
FIG. 6 shows the ridge width dependence of the lasing wavelength of the element lasers.

FIG. 6 shows the lasing wavelength of the lasers of the array of FIG. 2 having a ridge width covering the range of 1.6 µm to 5.2 µm. In FIG. 6 the circular dot indicates the central wavelength for each laser operated under C.W. conditions measured at 1.5 Ith and 20° C. A range in lasing wavelength shift of 8 nm in total is achieved. The vertical line associated with each dot reflects the fine tuning range available through the thermal effects previously discussed.

It will be noted that for widths less than 3 µm the wavelength shifts of the lasers are approximately linear with the increase in ridge width. For a width greater than 3 µm the tuning effect tends to become saturated. From this it is apparent that in order to achieve uniform wavelength spacing the difference in ridge width must increase from the narrow ones to the wider ones. The accuracy of the ridge width and hence the wavelength setting is, of course, dependent on the photolithography and etching processes. In any event, any fine tuning of the operational wavelength that may be required due to processing inaccuracies, etc., can be overcome by the thermal fine tuning effects previously discussed and indicated in FIG. 6. Hence, it is within the scope of this invention to produce an array of laser diodes having any specific Bragg wavelength within the defined wavelength range. This also permits individual lasers within the range to be tuned to specific wavelengths so as to optimize the number of channels that may be utilized in a WDM system.

Because the laser array is processed on one chip the spatial accuracy between elements is assured. Further, the array may be integrated into an optoelectronic circuit. The yield of single mode lasers within the array is high because of the gain-coupled structure.

Although specific embodiments of the invention have been discussed and illustrated it will be apparent to one skilled in the art that variations are possible. It is to be understood, however, that such variations will come within the scope of the invention as defined by the appended claims.

We claim:

1. A multi-wavelength semiconductor laser array comprising:

a plurality of distributed feedback, gain coupled, ridge waveguide semiconductor laser diodes longitudinally spaced on a common substrate, each of said laser diodes having active region capable of generating light and gain for lasing action in response to an injection current, a gain coupling grating in the active region, a buffer layer on said grating, a current confining ridge waveguide in said buffer layer, contacts on each ridge waveguide and substrate and resistive heater means associated with each laser, whereby the operational wavelength of the light generated by lasing action in each laser is a function of the width of each ridge waveguide, said operational wavelength being dynamically tunable by said resistive heater means associated with each laser.

2. A multi-wavelength laser array as defined in claim 1 said laser diodes being equally spaced on said common substrate.

3. A multi-wavelength laser array as defined in claim 2, the center to center spacing of respective lasers being 250 µm.

4. A multi-wavelength laser array as defined in claim 3 said resistive heater means being a thin film resistor.

5. A multi-wavelength laser array as defined in claim 4, said thin film resistor being titanium.

6. A multi-wavelength laser array as defined in claim 4, said thin film resistor being nichrome.

7. A multi-wavelength laser array as defined in claim 4, said thin film resistor being platinum.

8. A multi-wavelength array as defined in claim 4 said semiconductor being InGaAsP/InP.

9. A multi-wavelength laser array as defined in claim 8 the width of said ridge waveguides being in the range of 1.6 µm to 5.2 µm.

10. A multi-wavelength laser array as defined in claim 9, the operational wavelength differential being approximately 9 nm.

* * * * *